United States Patent [19]

Sandhu et al.

[11] Patent Number: 5,344,792
[45] Date of Patent: Sep. 6, 1994

[54] PULSED PLASMA ENHANCED CVD OF METAL SILICIDE CONDUCTIVE FILMS SUCH AS TISI$_2$

[75] Inventors: Gurtej S. Sandhu; Trung T. Doan, both of Boise, Id.

[73] Assignee: Micron Technology, Inc., Boise, Id.

[21] Appl. No.: 26,525

[22] Filed: Mar. 4, 1993

[51] Int. Cl.$^5$ ............................................. H01L 21/44
[52] U.S. Cl. ..................... 437/200; 437/174; 156/657; 313/231.31; 117/92; 117/939
[58] Field of Search ................ 437/200, 174; 313/231.31; 156/657, 613

[56] References Cited

U.S. PATENT DOCUMENTS

| | | | |
|---|---|---|---|
| 4,608,271 | 8/1986 | Heiber et al. | 437/200 |
| 4,877,641 | 10/1989 | Dory | 427/38 |
| 4,883,686 | 11/1989 | Doehler et al. | 427/38 |
| 4,935,661 | 6/1990 | Heimecke et al. | 313/231.31 |
| 4,977,106 | 12/1990 | Smith | 437/192 |
| 5,084,417 | 1/1992 | Joshi et al. | 437/192 |
| 5,160,408 | 11/1992 | Long | 156/657 |

FOREIGN PATENT DOCUMENTS 1149965 6/1989 Japan.

OTHER PUBLICATIONS

Kang et al., "Dependence of oxygen redistribution on titanium film thickness during titanium silicide formation by rapid thermal annealing", J. Vac. Sci. Technol A7(6), Nov./Dec. 1989, pp. 3246-3250.

Rosler et al., "Plasma-enhanced CVD of titanium silicide", J. Vac. Sci. Technol B2(4), Oct.-Dec. 1984, pp. 733-737.

Lee et al., "Plasma Enhanced Chemical Vapor Deposition of Blanket TiSi$_2$ on Oxide Patterned Wafers", J. Electrochem, Soc., vol. 139, No. 4, Apr. 1992, pp. 1159-1165.

Kwong et al, SPIE, vol. 1189, Rapid isothermal processing (1989), pp. 109-120.

Ho et al "Formation of self-aligned TiSi$_2$ for VLSI contacts and Interconnects", J. Vac. Sci. Tech, A5(4), Ju.-Aug. (1987), pp. 1396-1401.

Primary Examiner—R. Bruce Breneman
Assistant Examiner—Ramamohan Rao Paladugu
Attorney, Agent, or Firm—Stephen A. Gratton

[57] ABSTRACT

In semiconductor manufacture, a pulse plasma enhanced chemical vapor deposition (PPECVD) method is provided for depositing a conductive film of low resistivity on a substrate. The PPECVD method is especially suited to the deposition of metal silicides such as TiSi$_x$ on a silicon substrate during contact metallization. The PPECVD method can be carried out in a vacuum reaction chamber of a cold wall CVD reactor. A metal precursor deposition gas such as TiCl$_4$ is reacted with a silicon source gas such as SiH$_4$ at a deposition temperature of about 500° C. For generating a pulsed plasma, an rf power supply is coupled to the reaction chamber and to a pulse generator.

14 Claims, 2 Drawing Sheets

PULSED PLASMA ENHANCED CVD OF METAL SILICIDE CONDUCTIVE FILMS SUCH AS TISI₂

FIELD OF THE INVENTION

This invention relates to the deposition of films in semiconductor manufacture and particularly to a pulse plasma enhanced chemical vapor deposition method for depositing conductive films. The method of the invention is especially suited to the deposition of $TiSi_x$ films in a semiconductor contact metallization process.

BACKGROUND OF THE INVENTION

Microchip fabrication involves the formation of integrated circuits (ICs) on a semiconducting substrate. A large number of semiconductor devices are typically constructed on a monolithic substrate of a single crystal silicon material. The semiconductor devices are formed by various processes such as doping and patterning the substrate and by depositing various conducting and insulating layers on the substrate.

The continued miniaturization of integrated circuits has brought about an increasing need to reduce resistivities in the source-drain-gate regions and of the contact metallurgy to these regions. Recently, much effort has been focused on the use of different conducting materials and metal silicides to form such contacts.

One conducting material that is used in such applications is titanium nitride (TiN). In the past, titanium nitride films have been used in semiconductor manufacture for local interconnects and as contacts to semiconductor devices. Recently, titanium nitride films have been used in advanced metallization technology for manufacturing ultra large scale integrated circuits (ULSI).

In these applications, titanium nitride may be used as a diffusion barrier against junction spiking for aluminum contacts to silicon. In addition, titanium nitride may be used as a glue layer between tungsten (W) and intermetal dielectrics in a semiconductor structure. Titanium nitride may also be used to preserve the integrity of junctions in a semiconductor structure from worm hole effects during the chemical vapor deposition (CVD) of tungsten.

Improved processes have recently been developed for depositing conductive films such as titanium nitride, particularly for contact metallization. As an example, different methods of chemical vapor deposition (CVD) and plasma enhanced chemical vapor deposition (PECVD) of titanium nitride have recently been developed.

In general, single phase titanium nitride films deposited onto a silicon substrate with a CVD process have a high contact resistance. For this reason, during metallization and contact formation using titanium nitride, a separate conductive layer of titanium is typically deposited on the silicon substrate. During the deposition process, the titanium layer is thermally reacted with silicon on the surface of the substrate to form a layer of $TiSi_x$, such as titanium silicide ($TiSi_2$). This process is sometimes referred to as silicidation. The layer of $TiSi_x$ can be used to form contacts having low contact resistance and good barrier properties.

This technology however, is not entirely suitable to the manufacture of ultra large scale integrated circuits (ULSI). Such high density circuits are formed with semiconductor devices having scaled down features. The contact junctions formed in the silicon substrate are thus relatively small and shallow in depth. Since the silicon in the junction region is consumed during the silicidation process in proportion to the thickness of the silicide that is formed, the shallow junction structure may be adversely affected during silicidation process. Specifically, it is difficult to make low resistance, reliable and thermally stable titanium silicide contacts to shallow junctions. Another problem associated with this technology is that reliable techniques for the deposition of highly conformal $TiSi_x$ films have not heretofore been developed.

In order to address these problems, various low pressure chemical vapor deposition (LPCVD) processes for depositing a layer of $TiSi_x$ on silicon have been proposed. As an example, LPCVD processes have been studied using a titanium precursor such as titanium tetrachloride ($TiCl_4$) and a source of silicon such as silane ($SiH_4$) to deposit $TiSi_x$ film.

A problem with such processes is that reaction temperatures in excess of 730° C. are required. These temperatures are above the melting point of some of the materials used to form the semiconductor structure. Aluminum, for instance, melts at a temperature of about 600° C. Another shortcoming of these prior art processes is that a seed layer of polysilicon may be required in order to deposit any $TiSi_x$ on a silicon substrate. Moreover, the films deposited in accordance with these methods have poor adhesion and rough surfaces.

Plasma enhanced chemical vapor deposition (PECVD) has also been utilized in the deposition of $TiSi_x$ films. Although a PECVD process can be performed at lower temperatures than the LPCVD processes previously described with PECVD, the bulk resistivity of the deposited films is relatively high ($>250$ $\mu\Omega$-cm). Furthermore, films deposited using PECVD are relatively rough.

As is apparent from the foregoing, there is a need in the semiconductor art for improved methods for depositing conductive films and particularly titanium silicide ($TiSi_x$) films on silicon for contact metallization. Accordingly, it is an object of the present invention to provide an improved method for depositing conductive films such as $TiSi_x$ on a substrate utilizing pulsed-plasma enhanced chemical vapor deposition (PPECVD). It is a further object of the present invention to provide a pulsed plasma enhanced chemical vapor deposition (PPECVD) method in which high quality conductive films, and particularly $TiSi_x$ films can be conformally deposited on a substrate. It is yet another object of the present invention to provide a pulsed plasma enhanced chemical vapor deposition process for depositing $TiSi_x$, and other conductive films, on a substrate in which a deposited film is characterized by a smooth surface and a low bulk resistivity. Finally, it is an object of the present invention to provide a pulsed-plasma enhanced chemical vapor deposition (PPECVD) method for depositing $TiSi_x$ and other conductive films on a substrate that is suitable for large scale semiconductor manufacture and particularly semiconductor contact metallization for ULSI circuits.

SUMMARY OF THE INVENTION

In accordance with the present invention, a method of depositing conductive films on a substrate for semiconductor manufacture is provided. The method utilizes pulse plasma enhanced chemical vapor deposition (PPECVD) to deposit high quality conformal conductive films on a substrate (e.g. silicon, polysilicon, SiO$_2$). The PPECVD is carried out in a cold wall reactor at vacuum pressures and relatively low temperatures (e.g. 500° C.). During PPECVD, a metal precursor deposition gas is reacted with a silicon source deposition gas. A pulsed plasma is generated using a high frequency rf power source modulated with a pulse generator. The deposited films are characterized by a low resistivity, fine grain structure and a smooth surface. Following deposition, a rapid thermal anneal (RTA) step can be used to reduce the resistivity of the deposited films even lower.

By pulsing the plasma power "on" and "off" or between "high" and "low" levels, the reaction mechanics of the deposition process are improved. In particular, during high pulse power the reaction mechanics for depositing the reactant species onto the substrate are optimized. During a low or off pulse power, the diffusion of by products from the substrate is optimized. The pulsed plasma thus leads to a shift in the dynamic equilibrium of the plasma and changes the average density of various intermediate ion species present in the reaction chamber. This change in the reaction kinetics can be controlled for depositing films with desirable characteristics.

In an illustrative embodiment of the invention, TiSi$_x$ is deposited on a silicon substrate during contact metallization for forming low resistivity contacts. For depositing TiSi$_x$ on silicon, a titanium precursor deposition gas, such as titanium tetrachloride (TiCl$_4$), is reacted with a silicon source deposition gas, such as silane (SiH$_4$), in a cold wall reactor. The rf power, duty cycle and modulation frequency of the rf power source can be varied to achieve desired film characteristics.

Other objects, advantages and capabilities of the present invention will become more apparent as the description proceeds.

DETAILED DESCRIPTION OF THE PREFERRED EMBODIMENT

Figure 1:
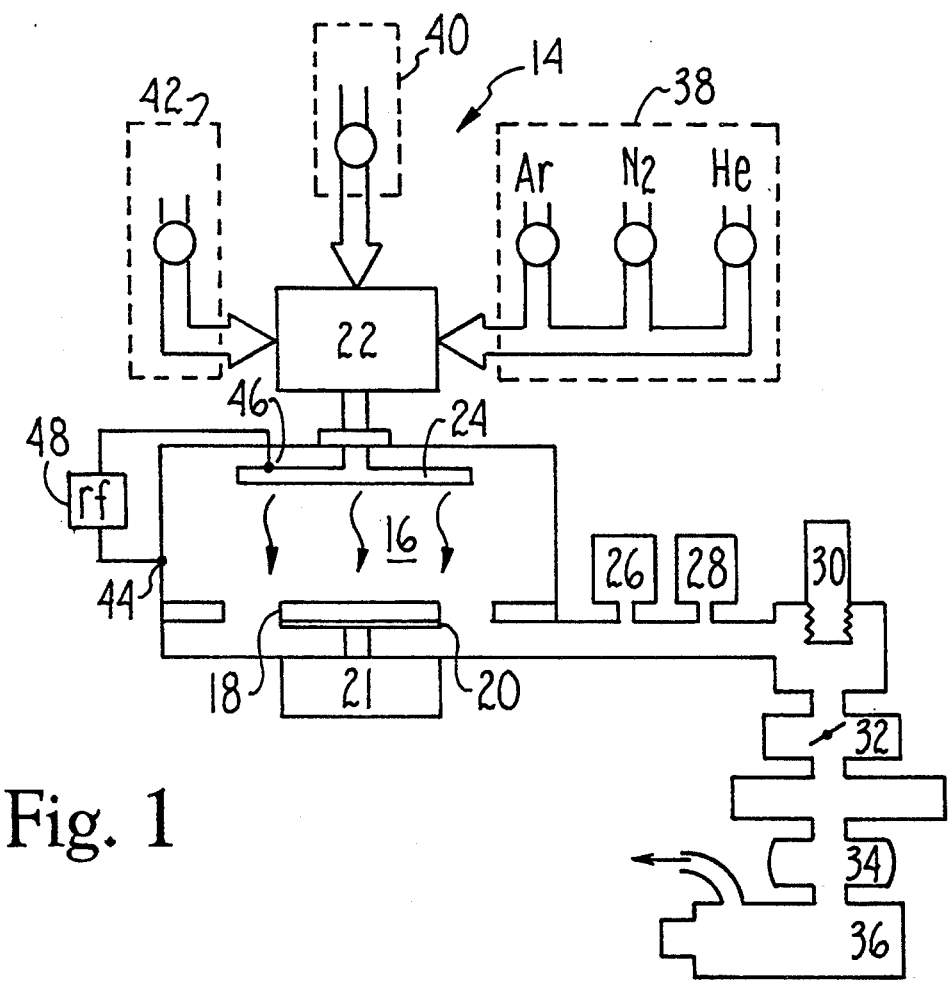
FIG. 1 is a schematic diagram of a cold wall reactor for carrying out the method of the invention.

The method of the invention, broadly stated, comprises the pulsed plasma enhanced chemical vapor deposition (PPECVD) of a conductive film on a substrate. The PPECVD process of the invention is especially suited for depositing a metal silicide such as TiSi$_x$ on a silicon, polysilicon, or SiO$_2$ substrate.

For depositing a metal silicide on a substrate, the method of the invention includes the steps of:
1. Placing the substrate in a CVD reaction chamber.
2. Maintaining the reaction chamber under a vacuum pressure.
3. Introducing a metal precursor deposition gas into the reaction chamber along with a silicon source gas for reaction with the metal precursor gas for depositing a conductive film on the substrate.
4. Generating a plasma from the gases within the reaction chamber by introducing a plasma forming energy into the reaction chamber.
5. Pulsing the plasma energy to shift the dynamic equilibrium of the plasma for optimizing the reaction mechanics for depositing the conductive film.
6. Adjusting the parameters of the deposition process to form a film with predetermined characteristics.

In an illustrative embodiment, the PPECVD method of the invention is performed in a cold wall CVD reactor. An rf power source is coupled to the reaction chamber to provide a plasma energy. For pulsing the plasma between an "on" and "off" or a "high" and "low" level, the rf power is pulsed or modulated using a pulse generator.

Other methods of generating an energy pulse for pulsing the plasma may also be utilized. These alternate pulse generating methods may include a pressure pulse, a heat pulse, a laser pulse, microwave modulation, and others.

With an rf power source, process parameters such as rf power, duty cycle and modulation frequency have a significant effect on the characteristics of the deposited film. In addition, process parameters such as deposition temperature, pressure and gas flow rates also have a significant effect on the characteristics of the deposited film. In accordance with the invention, each of these parameters can be adjusted to produce a film having desired characteristics.

The PPECVD method of the invention is especially suited to the formation of metal silicide contacts and interlayer interconnects in semiconductor structures. Conductive materials other than metal silicides, however, such as titanium, tungsten, molybdenum, tantalum and metal nitrides such as titanium nitride, tungsten nitride and tantalum nitride may also be deposited.

For depositing a metal silicide, a suitable metal precursor gas for the deposition reaction can be formed from an organic or inorganic metal source. For the deposition of TiSi$_x$, suitable titanium sources include TiCl$_4$; [Ti(N(R)$_2$)$_4$] where R=CH$_3$ (TDMAT) where R=C$_2$H$_5$ TDEAT; Cp$_2$Ti (N3)$_2$ where Cp=C$_5$H$_5$ group (biscyclopentadienyl titanium diazide); Cp$_2$Ti Cl$_2$ where Cp=C$_5$H$_5$ group (biscyclo pentadienyl titanium dichloride); and Tris (2, 2' bipyridine) titanium. Other suitable titanium sources are listed in the example to follow. Other conductive layers such as refractory metal silicides may be deposited utilizing a suitable metal halide such as pentachlorides, hexachlorides, pentafluorides, and hexafluorides.

For depositing a metal silicide film, a silicon source gas is also required for reaction with the metal precursor deposition gas. Either an organic or inorganic silicon source gas may be utilized. Suitable silicon source gases include silane (SiH$_4$), disilane (Si$_2$H$_6$), silicon tetrabromide (SiBr$_4$), silicon tetrafluoride (SiF$_4$) and dichlorosilane (SiH$_2$Cl$_2$). Other suitable organosilicon compounds include hexamethyldisilazane (HMDS), dimethyldichlorosilane (DMDCS), trimethylchlorsilane (TMCS), dimethyldimethoxsilane (DMDMOS) and bis(dimethylamino)-dimethysilane (BDMADMS). However, any functionally equivalent organosilicone compound would be within the scope and spirit of the present invention.

Films can be deposited in accordance with the PPECVD method of the invention with an extremely low resistivity. Following deposition, a rapid thermal annealing (RTA) step can be used to further lower the resistivity. Films deposited in accordance with the PPECVD method of the invention are further characterized by a smooth surface and a fine dense grain structure.

A suitable cold wall CVD reactor 14 for carrying out the method of the invention is shown in FIG. 1. The cold wall CVD reactor 14 includes a reaction chamber 16 wherein a silicon wafer 18 may be located on a graphite or steel boat 20. The graphite boat 20 is heated to a desired temperature by halogen lamps 21. The cold wall CVD reactor 14 may also include a premix chamber 22 wherein the gases are mixed prior to being directed through a shower head 24 into the reaction chamber 16. The cold wall CVD system may also include pressure control means in the form of a pressure sensor 26, a pressure switch 28, an air operated vacuum valve 30, and pressure control valve 32. In addition, reactant gases given off by the chemical reaction are drawn by a roots blower 34 into a particulate filter 36 and to the atmosphere.

A supply of carrier gases 38 are coupled through suitable valving to the premix chamber 22. The carrier gases may include Argon, Nitrogen, and Helium and other suitable inert gases. A supply of the metal precursor deposition gas 40 is also coupled to the premix chamber through suitable valving. A silicon source gas 42, such as a silane ($SiH_4$), is also coupled to the premix chamber 22 using suitable valving.

With this arrangement the inert carrier gases, the metal precursor deposition gas, and the silicon source gas can be combined in the premix chamber 22. The temperatures and flow rates of the gases can be controlled to achieve the desired reaction and film quality.

For generating a plasma, a pair of rf electrodes 44, 46 is located within the reaction chamber 16. A grounded electrode 44 is connected to the chamber walls. A positive electrode 46 is located within the reaction chamber 16. The rf electrodes 44, 46 are connected to a power supply 48. The power supply 48 is a modulated rf power source which creates a radio frequency (rf) field through the electrodes 44, 46 and in the reaction chamber 16. With such a cold wall CVD reactor 14 the power may be on the order of 25 W to 500 W. Alternately, other power sources such as microwave power or DC power may be utilized in place of rf power.

The rf field energizes the gas mixture to a plasma state. In general, the plasma comprises mobile, positively and negatively charged particles. These particles interact because of the attraction or repulsion resulting from the electric field surrounding each charged particle, i.e. Coulomb forces. Plasma particle species include neutral atoms, electrons and ions. Typically, the density of opposite charges in a gaseous plasma is equal and thus the plasma is electrically neutral. The reacting gases are ionized and dissociated by electron impact. These ions then combine on the surface of the substrate as the deposition compound.

In accordance with the method of the invention, the rf power for forming the plasma is modulated using a pulse generator. The pulse generator functions to change the amplitude of the power "on" and "off" or from "high" to "low". This cycles the plasma state between an "on" state and an "off" state and between a "high" to "low" plasma density state.

In addition, the pulse generator may be adjusted for changing the pulse amplitude, pulse frequency, and duty cycle of the pulses. The frequency of the pulse generation may be from 50 Hz to 10,000 Hz. In addition, the duty cycle of the pulses has a significant effect on the characteristics of the deposited film. Such a duty cycle can be defined as a percentage of the pulse time period during which the pulse is "on".

It is theorized that at an on, or high power phase, of a pulse cycle, the deposition of the reactant species onto the substrate proceeds at an optimal rate. On the other hand, during the off or low power phase of a pulse cycle, the diffusion of reaction by-products away from the substrate proceeds at an optimal rate. Stated differently, during the off phase, reaction by-products are pumped away so that the deposition process can proceed more efficiently. The use of the pulsed plasma thus leads to a shift in the dynamic equilibrium of the plasma. This changes the average density of various intermediate ion species present in the reaction chamber. By controlling the process parameters (i.e. power, pulse, temperature, gas streams, chemistries), the reaction kinetics can be controlled for depositing films with desirable characteristics (i.e. low resistivity, smooth surface, dense grain structure).

As an example, the reaction chemistry can be controlled such that a constant low concentration of silicon ions is maintained in the reaction chamber. With a low silicon concentration, the Si content of a deposited silicide can be kept low. This produces films with a low resistivity.

The flow rates of the metal precursor deposition gas, the silicon source gas and the carrier gases also have a significant effect on the deposited film. By way of example, the flow rate of the carrier gases (Ar, $N_2$, He) may be as great as five to ten times the flow rate of the silicon source gas. The flow rate of the silicon source gas in turn may range from a percentage of the flow rate of the metal precursor deposition gas (i.e. silicon gas flow <- precursor gas flow) up to 100 times greater than the flow ratio of the metal precursor deposition gas. For a CVD reactor 14 as previously described, gas flow rates in the range of 1–50 sccm are representative.

The temperature at which the substrate is maintained also has a significant effect on the characteristics of the deposited film. For a CVD reactor 14 as described above, process temperatures in the range of 200°–700° C. can be utilized. Process pressures for such a CVD reactor 14 may be in the range of 1 m Torr–5 Torr.

EXAMPLE—DEPOSITION OF TiSi$_x$

TiSi$_x$ conductive films were deposited in accordance with the method of the invention on a silicon oxide substrate in a semiconductor metallization process. For depositing TiSi$_x$, a precursor deposition gas was formed from titanium tetrachloride (TiCl$_4$). Argon was used as a carrier gas to bubble through the TiCl$_4$ contained in a quartz ampule at 50° C.

Alternately, for depositing TiSi$_x$, the precursor deposition gas may be selected from the group consisting of titanium tetrachloride (TiCl$_4$), [Ti (N(R)$_2$)$_4$], where R=CH$_3$ (TDMAT) where R=C$_2$H$_5$ TDEAT; Cp$_2$Ti(N3)$_2$ where Cp=C$_5$H$_5$ group (biscyclopentadienyl titanium diazide); Cp$_2$TiCl$_2$ where Cp=C$_5$H$_5$ group (biscyclo pentadienyl titanium dichloride); Tris (2, 2' bipyridine) titanium; or a metal dialkylamide such as Ti(NMe$_2$)$_4$; Ti(NEt$_2$)$_4$; Ti(N-n-Pr$_2$)$_4$; or Ti (N-n-Bu$_2$)$_4$.

A silicon source gas for depositing the TiSi$_x$ was silane (SiH$_4$). Alternately, a silicon source gas may be selected from an organic or inorganic source as previously identified.

Depositions were performed in a cold wall single wafer reactor over a wide range of temperatures, pressures, gas flow rates, and rf power. The films were deposited on silicon and silicon dioxide substrates. The deposited TiSi$_x$ films were compared to films deposited by conventional non-pulsed PECVD.

Pulsing the plasma results in a stringent control of the plasma chemistry. During an off or low power state of the plasma, reaction by-products can be pumped away. This helps to maintain the thermodynamic equilibrium of the reaction species in the plasma. For the case of TiCl$_4$ and SiH$_4$ plasma, SiH$_4$ is more easily ionized (as compared to TiCl$_4$). Accordingly, with a non-pulsed deposition its reactive concentration will keep building as the deposition progresses. In general, with a non-pulsed PECVD deposition TiSi$_x$ films rich in silicon are deposited. Silicon rich films have a high resistivity.

With a pulsed plasma enhanced chemical vapor deposition (PPECVD), on the other hand, a constant low concentration of reactive silane can be maintained in the reaction chamber. This is because during the off state, ions become neutral through recombination. By controlling the reaction chemistry in this manner, stoichiometric low resistivity films can be deposited. Furthermore, with PPECVD the inclusion of impurities can be reduced.

Table 1 shows the resistivity of TiSi$_x$ films deposited using a non-pulsed (PECVD) as compared to TiSi$_x$ films deposited with similar process parameters using pulsed plasma enhanced chemical vapor deposition (PPECVD) in accordance with the invention.

TABLE 1

For average plasma power = 30 Watts, 0.6 Torr pressure, substrate temperature = 450° C., 10 sccm silane, and 200 sccm Ar flow, followed by RTP anneal in N$_2$ at 800° C. for 30 seconds.

| PLASMA CONDITION | Rb (micro-ohms cm) |
|---|---|
| Non pulsed | 300 |
| Pulsed at 100 Hz | 55 |

In general, films deposited with pulsed plasma were highly reflective as compared to films deposited with a non-pulsed deposition process. In addition, pulse deposited films had a very low stress of 3.5 E9 dynes/cm$^2$. Moreover, a pulsed plasma produces a film with better step coverage. This is believed to be caused by an improved mean free path of the reactive species on the wafer surface.

Figure 2:
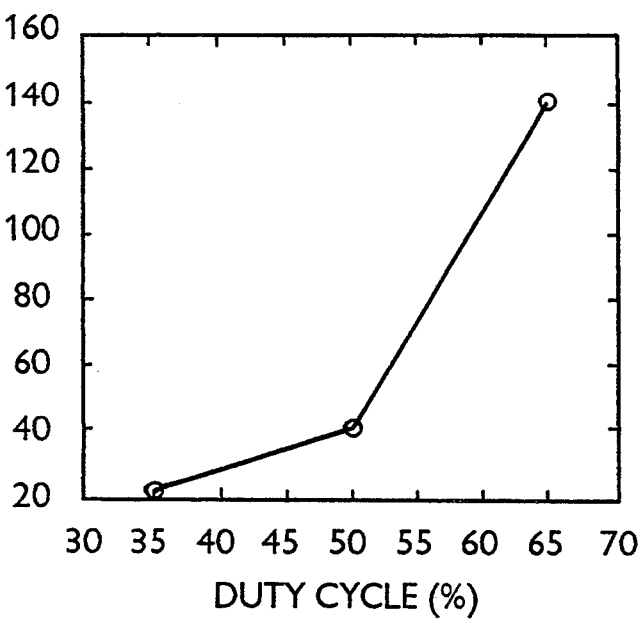
FIG. 2 is a graph showing the sheet resistivity of TiSi$_x$ films deposited in accordance with the invention, with the sheet resistivity shown as a function of duty cycle at an rf power of 50 W and a modulation frequency of 2500 Hz.

For the case of PPECVD films at a fixed power and modulation frequency, the sheet resistance increased with the duty cycle as shown in FIG. 2. One could surmise that an increase in the duty cycle in effect, leads to higher average rf power which could result in higher resistivity. However, when a lower duty cycle at higher power was used to match the average rf power, lower resistivity films were deposited.

Figure 3:
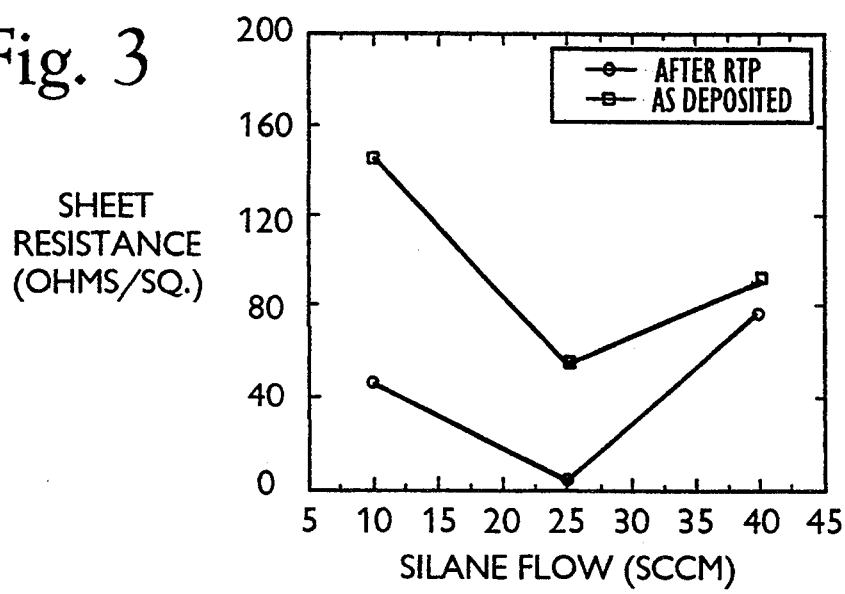
FIG. 3 is a graph showing the sheet resistance of TiSi$_x$ films deposited in accordance with the invention, with the sheet resistivity shown as a function of silane flow at a constant TiCl$_4$ flow rate of 5 sccm, a pressure of 800 mT and an rf power of 50 W.
Figure 4:
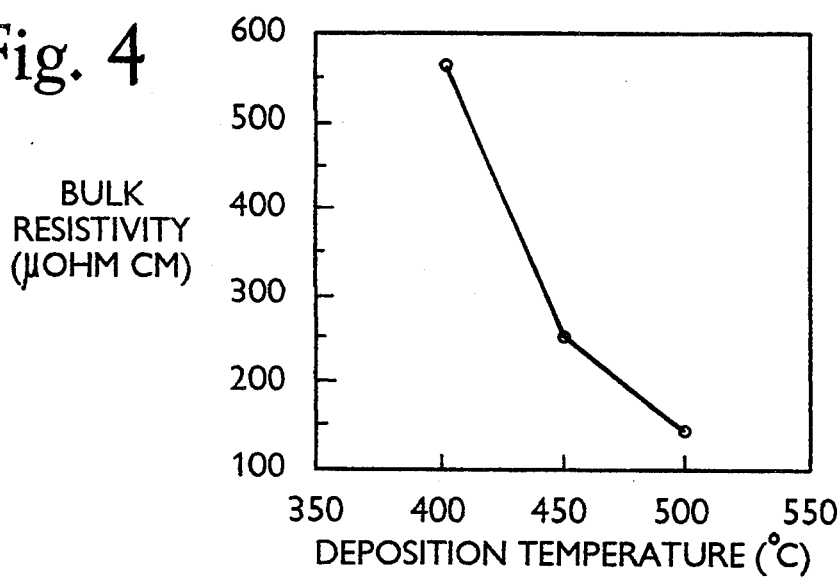
FIG. 4 is a graph showing the bulk resistivity of TiSi$_x$ films deposited in accordance with the invention, with the bulk resistivity shown as a function of the deposition temperature.

The deposition rate and resistivity of the films varied with gas flow rates and the ratio of TiCl$_4$ and SiH$_4$ flow rates. FIG. 3 shows the variation of sheet resistivity of the "as deposited" and "after RTP" films with silane flow. In general, resistivity of the films was lowered after annealing in N$_2$ ambient at 800° C. for 20 seconds. FIG. 3 shows that the degree to which film resistivity is lowered after RTA varies with the partial pressure of silane. Films deposited at 25 sccm silane flow show the lowest sheet. This film had a sheet resistivity equivalent to a bulk resistivity of 20 $\mu\Omega$-cm after RTA as shown in FIG. 3. The bulk resistivity of the as deposited films decreased at higher deposition temperatures as shown in FIG. 4. It is believed that at higher deposition temperatures, the microstructure and crystal structure of the film changes over to a low resistivity phase.

Films deposited using pulsed PECVD showed a dramatic improvement in surface topography. In general, the grain density and fineness is much higher with the PPECVD films. In addition, PPECVD films do not show any surface irregularities. Film adhesion to a SiO$_2$ substrate was excellent except for the case of very low silane flows and rf power.

Figure 5:
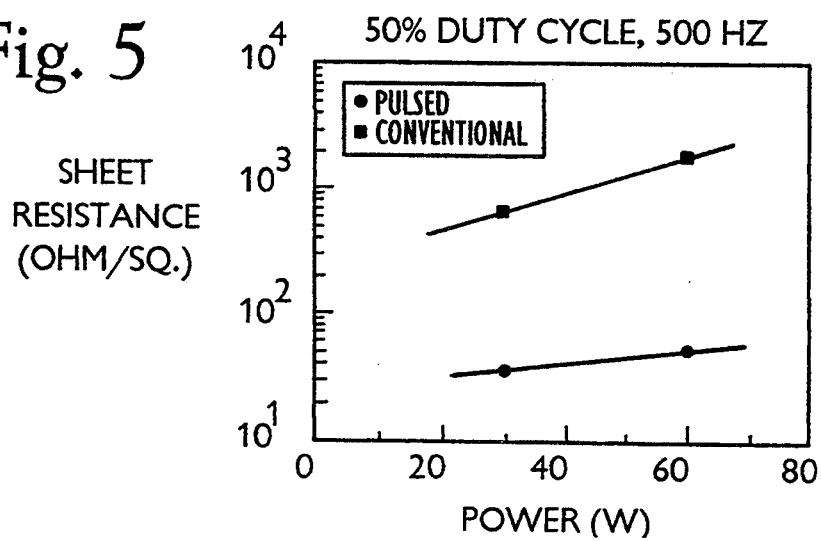
FIG. 5 is a graph showing the sheet resistance of TiSi$_x$ films deposited with a conventional prior art plasma deposition process as compared to the sheet resistance of TiSi$_x$ films deposited in accordance with the method of the invention as a function of the power of an rf source.

FIG. 5 compares the sheet resistance as a function of rf power of TiSi$_x$ films deposited using PPECVD versus films deposited using conventional PECVD. At the same power, a decrease in resistivity of more than an order of magnitude is obtained with pulse plasma enhanced CVD.

In conclusion, pulsed plasma enhanced chemical vapor deposition (PPECVD) can be used to deposit stoichiometric TiSi$_x$ films at a temperature of 500° C. using TiCl$_4$ as a metal precursor source and SiH4 as a silane source. As deposited film resistivities decreased at higher deposition temperatures. Films with a bulk resistivity as low as 20 $\mu\Omega$-cm after post deposition rapid thermal anneal have been obtained. Compared to conventional PECVD, films deposited using PPECVD showed lower resistivity and a smoother surface texture for the same average rf power. The films also showed good adhesion to the substrate.

Although the invention has been described in terms of a preferred embodiment for depositing a TiSi$_x$ film, other silicides and conductive layers can also be deposited in accordance with the invention. Thus, it is intended that alternate embodiments of the inventive concepts expressed herein be contained within the scope of the following claims.

What is claimed is:

1. In semiconductor manufacture a CVD method for depositing a metal silicide conductive film on a substrate comprising:

placing the substrate in a CVD reaction chamber;

maintaining the reaction chamber under vacuum pressure;

introducing a metal precursor deposition gas and a silicon source gas into the reaction chamber for reaction to deposit the metal silicide conductive film on the substrate wherein said metal precursor gas is selected from the group consisting of an organic or inorganic metal source and said silicon source gas is selected from the group consisting of an organic or inorganic silicon source;

generating a plasma from the gases within the reaction chamber by introducing a plasma forming energy into the reaction chamber;

pulsing the plasma energy to shift the dynamic equilibrium of the plasma for reaction mechanics for depositing the metal silicide conductive film and diffusing reactant by products away from the substrate;

adjusting a pulse power, a pulse duration and a gas chemistry of the metal precursor deposition gas and silicon source gas during deposition to improve deposition reaction mechanics and form the metal silicide film with an as deposited resistivity; and then annealing the metal silicide conductive film using a rapid thermal anneal to lower the as deposited resistivity.

2. The CVD method as recited in claim 1 and wherein the plasma is generated using a power source selected from the group consisting of modulated rf power, microwave power, or DC power.

3. The CVD method as recited in claim 2 and wherein the reaction chamber comprises a cold wall CVD reactor.

4. The CVD method as recited in claim 3 and wherein the metal silicide conductive film is $TiSi_2$ having a resistivity after rapid thermal annealing of about 20 $\mu\Omega$-cm.

5. In semiconductor manufacture, a pulse plasma enhanced chemical vapor deposition (PPECVD) method for depositing a metal silicide conductive film on a substrate, comprising:

placing the substrate in a CVD reaction chamber of a cold wall reactor said substrate including a material selected from the class of materials consisting of silicon, polysilicon or $SiO_2$;

maintaining the reaction chamber under a vacuum pressure;

introducing a metal precursor deposition gas and a silicon source gas into the reaction chamber for reaction with the metal silicide conductive film on the substrate wherein said metal precursor deposition gas is selected from the group consisting of a metal halide, a metal dialkyamide, ($TiCl_4$), (TDEAT), (TDMAT), (TZAT), or (Tris (2, 2' bipyridine) titanium) and said silicon source gas is selected from the group consisting of ($SiH_4$), ($Si_2H_6$), ($SiBr_4$), ($SiF_4$), ($SiH_2Cl_2$), (HMDS), (DMDCS), (TMCS), (DMDMOS), or (BDMADMS);

generating a plasma from the gases within the reaction chamber using an rf power source coupled to the reaction chamber;

pulsing the rf power to form a pulsed plasma;

adjusting the rf power and a gas chemistry of the metal precursor deposition gas and silicon source gas during deposition of the metal silicide conductive film to improve deposition reaction mechanics and form the metal silicide conductive film with an as deposited resistivity; and then annealing the metal silicide conductive film using a rapid thermal anneal to lower the as deposited resistivity.

6. The PPECVD method as recited in claim 4 and wherein the power source is an rf pulse generator pulsed at a frequency of between 50 Hz–10,000 Hz.

7. The PPECVD method as recited in claim 6 and wherein a deposition temperature is between about 200°–700° C., and a silicon source gas flow is between about 5–40 sccm.

8. The PPECVD method as recited in claim 7 and wherein the pulses are with a duty cycle in range of 15–80%.

9. In semiconductor manufacture, a PPECVD method for depositing a $TiSi_2$ film on a substrate comprising:

placing the substrate in a CVD reaction chamber of a cold wall reactor said substrate including a material selected from the class consisting of silicon, polysilicon or $SiO_2$;

maintaining the reaction chamber under a vacuum pressure;

introducing a titanium precursor deposition gas selected from the group consisting of, a metal dialkyamide, ($TiCl_4$), (TDMAT), (TDEAT), (TZAT), or (Tris (2, 2' bipyridine) titanium) into the reaction chamber along with a reactant silicon source gas selected from the group consisting of ($SiH_4$), ($Si_2H_6$), ($SiBr_4$), ($SiF_4$), ($SiH_2Cl_2$), (HMDS), (DMDCS), (TMCS), (DMDMOS), or (BDMADMS) for reaction with the precursor deposition gas for depositing the $TiSi_2$ film on the substrate;

generating a plasma from the gases within the reaction chamber by introducing a plasma forming energy into the reaction chamber;

pulsing the plasma energy to shift a dynamic equilibrium of the plasma for the reaction mechanics for depositing the $TiSi_2$ film; and adjusting the plasma energy, a pulse duration and a gas chemistry to form the $TiSi_2$ film with an as deposited resistivity; and then annealing the $TiSi_2$ film using a rapid thermal anneal to lower the as deposited resistivity.

10. The PPECVD method as recited in claim 9 and wherein the metal precursor deposition gas is ($TiCl_4$) and the silicon source gas is ($SiH_4$).

11. The PPECVD method as recited in claim 9 and wherein the plasma is generated with an rf power supply that is pulsed using a pulse generator.

12. The PPECVD method as recited in claim 9 and wherein the $TiSi_2$ film is used in a contact metallization process to form low resistivity contacts.

13. The PPECVD method as recited in claim 12 and wherein the deposition temperature is from 200°–700° C. and a flow rate of the silicon source gas is between about 5–40 sccm.

14. The PPECVD method as recited in claim 13 and wherein the deposited $TiSi_2$ has a bulk resistivity of about 20 $\mu\Omega$-cm.

* * * * *